US010217886B2

(12) United States Patent
Kim et al.

(10) Patent No.: US 10,217,886 B2
(45) Date of Patent: Feb. 26, 2019

(54) PHOTOELECTRIC CONVERSION DEVICE

(75) Inventors: Kyu Sik Kim, Jeonju-si (KR); Musubu Ichikawa, Matsumoto (JP); Kwang Hee Lee, Suwon-si (KR); Kyung Bae Park, Seoul (KR); Toshiki Takeuchi, Matsumoto (JP)

(73) Assignees: Samsung Electronics Co., Ltd., Gyeonggi-Do (KR); Shinshu University, Matsumoto (JP)

( * ) Notice: Subject to any disclaimer, the term of this patent is extended or adjusted under 35 U.S.C. 154(b) by 576 days.

(21) Appl. No.: 13/409,878

(22) Filed: Mar. 1, 2012

(65) Prior Publication Data
US 2013/0049152 A1 Feb. 28, 2013

(30) Foreign Application Priority Data
Aug. 31, 2011 (KR) ........................ 10-2011-0087792

(51) Int. Cl.
*H01L 31/0328* (2006.01)
*H01L 31/072* (2012.01)
(Continued)

(52) U.S. Cl.
CPC ............ *H01L 31/072* (2013.01); *B82Y 10/00* (2013.01); *H01L 27/307* (2013.01);
(Continued)

(58) Field of Classification Search
CPC ............ H01L 51/0046; H01L 51/4273; H01L 27/307; H01L 51/4246; H01L 27/14629;
(Continued)

(56) References Cited

U.S. PATENT DOCUMENTS 6,175,142 B1   1/2001   Ehara
6,262,465 B1   7/2001   Williamson et al.
(Continued)

FOREIGN PATENT DOCUMENTS

DE   102007029822 A1   1/2009
EP        2355165 A1   8/2011
(Continued)

OTHER PUBLICATIONS

Takeuchi et al., "Infrared light sensor based on shuttlecock-shape phtalocyanines", Extended Abstracts of the 58th Meeting, 2011: The Japan Society of Applied Physics and the Related Societies, Spring 2011, Kanagawa University of Engineering.
(Continued)

*Primary Examiner* — Shouxiang Hu
(74) *Attorney, Agent, or Firm* — Harness, Dickey & Pierce, P.L.C.

(57) ABSTRACT

According to example embodiments, a photoelectric conversion device includes a first electrode including a light-receiving surface, a second electrode spaced apart from the first electrode and facing the first electrode, and an auxiliary layer between the second electrode and an exciton producing layer. The first electrode may be on the second electrode. The exciton producing layer may be between the first electrode and the second electrode. The exciton producing layer may be spaced apart from the second electrode by a distance corresponding to one of a crest and a trough of a standing wave of light to be converted into electricity.

15 Claims, 3 Drawing Sheets

(51) Int. Cl.
*H01L 27/30* (2006.01)
*H01L 51/42* (2006.01)
*H01L 31/101* (2006.01)
*B82Y 10/00* (2011.01)
*H01L 51/00* (2006.01)

(52) U.S. Cl.
CPC ........ *H01L 31/101* (2013.01); *H01L 51/4246* (2013.01); *H01L 51/4273* (2013.01); *H01L 51/0037* (2013.01); *H01L 51/0046* (2013.01); *H01L 51/0068* (2013.01); *H01L 51/0078* (2013.01); *H01L 2251/308* (2013.01); *Y02E 10/549* (2013.01)

(58) Field of Classification Search
CPC ... H01L 31/101; H01L 31/103; H01L 31/105; H01L 31/107; H01L 31/1075; H01L 33/465; H01L 31/072; H01L 2251/308; H01L 51/0068; H01L 51/0037; H01L 51/0078; B82Y 10/00; Y02E 10/549
USPC ....... 257/21, 40, 431, E31.054, E31.063, 17, 257/458, 461, 464
See application file for complete search history.

(56) References Cited

U.S. PATENT DOCUMENTS

| | | | | |
|---|---|---|---|---|
| 6,483,862 | B1* | 11/2002 | Aronson | H01L 27/15 257/E27.12 |
| 7,045,833 | B2* | 5/2006 | Campbell et al. | 257/186 |
| 2008/0035965 | A1* | 2/2008 | Hayashi | H01L 27/14647 257/291 |
| 2011/0001128 | A1* | 1/2011 | Kim et al. | 257/40 |

FOREIGN PATENT DOCUMENTS

| | | |
|---|---|---|
| JP | 10-190037 A | 7/1998 |
| JP | 2008-72090 A | 3/2008 |
| JP | 2010-135636 A | 6/2010 |
| KR | 2001-0079915 A | 8/2001 |

OTHER PUBLICATIONS

Korean Office Action dated Jun. 13, 2017 issued in corresponding Korean Application No. 10-2011-0087792 (English translation provided).

* cited by examiner

PHOTOELECTRIC CONVERSION DEVICE

CROSS-REFERENCE TO RELATED APPLICATION

This application claims priority under 35 U.S.C. § 119 to Korean Patent Application No. 10-2011-0087792, filed in the Korean Intellectual Property Office on Aug. 31, 2011, the entire contents of which are incorporated herein by reference.

BACKGROUND

1. Field

Example embodiments relate to a photoelectric conversion device.

2. Description of the Related Art

Generally, a photoelectric conversion device refers to a device for converting light into an electric signal using photoelectric effects. A photoelectric conversion device may be applied to various photosensors such as an automobile sensor, a home sensor, a solar cell, and the like. A photoelectric conversion device may be applied to a CMOS image sensor.

Thereby, research on improving the photoelectric conversion efficiency of a photoelectric conversion device is being performed.

SUMMARY

According to example embodiments, a photoelectric conversion device selectively absorbs light having a certain wavelength and has excellent photoelectric conversion efficiency.

According to example embodiments, a photoelectric conversion device includes a first electrode including a light-receiving surface, a second electrode spaced apart from the first electrode and facing the first electrode, an auxiliary layer between the second electrode and an exciton producing layer. The first electrode may be on the second electrode. The exciton producing layer may be between the first electrode and the second electrode. The exciton producing layer may be spaced apart from the second electrode by a distance corresponding to one of a crest and a trough of a standing wave of light to be converted into electricity.

The standing wave may include a wavelength ranging from a visible ray region to a near infrared ray region. For example, the standing wave may include a wavelength of about 380 nm to about 950 nm.

The exciton producing layer may be may be spaced apart from the second electrode by a distance ($L_1$) range represented by the following Equation 1:

$$(\lambda_{\text{standing wave}}/(4*(n_{auxiliary})))-\alpha \leq L_1 \leq (\lambda_{\text{standing wave}}/(4*(n_{auxiliary})))+\alpha \quad \text{[Equation 1]}$$

In Equation 1, $\lambda_{standing\ wave}$ is a wavelength of a standing wave of light to be converted into electricity, $n_{auxiliary}$ is a refractive index of a material for an auxiliary layer, a ranges from about 0 nm to about 20 nm, and $L_1$ is a distance from the second electrode.

The $\lambda_{standing\ wave}$ may be a wavelength of a visible ray region to a near infrared ray region, and $\lambda_{standing\ wave}$ may be about 380 nm to about 950 nm.

The exciton producing layer may include one of a bulk heterojunction (BHJ), an organic/inorganic hybrid layer, a p layer, and a combination thereof.

The bulk heterojunction may include at least two of polyaniline, polypyrrole, polythiophene, poly(p-phenylene vinylene), MEH-PPV (poly(2-methoxy-5-(2'-ethyl-hexyloxy)-1,4-phenylene vinylene)), MDMO-PPV (poly(2-methoxy-5-(3,7-dimethyloctyloxy)-1,4-phenylene vinylene)), pentacene, PEDOT (poly(3,4-ethylene dioxythiophene)), poly(3-alkylthiophene), phthalocyanine, tin(II) phthalocyanine (SnPc), copper phthalocyanine, triarylamine, benzidine, pyrazoline, styrylamine, hydrazone, carbazole, thiophene, EDOT (3,4-ethylene dioxythiophene), pyrrole, phenanthrene, tetracene, naphthalene, rubrene, NTCDA (1,4,5,8-naphthalene-tetracarboxylic dianhydride), $Alq_3$, fullerene (C60, C70, C74, C76, C78, C82, C84, C720, C860, and the like), PCBM (1-(3-methoxy-carbonyl)propyl-1-phenyl(6,6)C61), C71-PCBM, C84-PCBM, bis-PCBM, perylene, a derivative thereof, and a combination thereof.

The organic/inorganic hybrid layer may include an organic material including one of polyaniline, polypyrrole, polythiophene, poly(p-phenylene vinylene), MEH-PPV (poly(2-methoxy-5-(2'-ethyl-hexyloxy)-1,4-phenylene vinylene)), MDMO-PPV (poly(2-methoxy-5-(3,7-dimethyloctyloxy)-1,4-phenylene vinylene)), pentacene, PEDOT (poly(3,4-ethylene dioxythiophene)), poly(3-alkylthiophene), phthalocyanine, tin(II) phthalocyanine (SnPc), copper phthalocyanine, triarylamine, benzidine, pyrazoline, styrylamine, hydrazone, carbazole, thiophene, EDOT (3,4-ethylene dioxythiophene), pyrrole, phenanthrene, tetracene, naphthalene, rubrene, NTCDA (1,4,5,8-naphthalene-tetracarboxylic dianhydride), $Alq_3$, fullerene (C60, C70, C74, C76, C78, C82, C84, C720, C860, and the like), PCBM (1-(3-methoxy-carbonyl)propyl-1-phenyl(6,6)C61), C71-PCBM, C84-PCBM, bis-PCBM, perylene, a derivative thereof, and a combination thereof, without limitation, and an inorganic semiconductor selected from CdS, CdTe, CdSe, ZnO, and a combination thereof, without limitation.

The p layer may include a p-type material including one of polyaniline, polypyrrole, polythiophene, poly(p-phenylene vinylene), MEH-PPV (poly(2-methoxy-5-(2'-ethyl-hexyloxy)-1,4-phenylene vinylene)), MDMO-PPV (poly(2-methoxy-5-(3,7-dimethyloctyloxy)-1,4-phenylene vinylene)), pentacene, PEDOT (poly(3,4-ethylene dioxythiophene)), poly(3-alkylthiophene), phthalocyanine, tin(II) phthalocyanine (SnPc), copper phthalocyanine, triarylamine, benzidine, pyrazoline, styrylamine, hydrazone, carbazole, thiophene, EDOT (3,4-ethylene dioxythiophene), pyrrole, phenanthrene, tetracene, naphthalene, rubrene, a derivative thereof, and a combination thereof.

The exciton producing layer may include a thickness of about 10 nm to about 200 nm.

The first electrode may include a transparent conductive material. The second electrode may include a metal or a transparent conductive material.

A work function of the first electrode may be the same or higher than a work function of the second electrode.

The auxiliary layer may include one of an n layer, an electron transport layer (ETL), a hole blocking layer (HBL), and a combination thereof.

The n layer may include an n-type material including one of an n-type organic material including one of fullerene (C60, C70, C74, C76, C78, C82, C84, C720, C860, and a combination thereof), PCBM (1-(3-methoxy-carbonyl)propyl-1-phenyl(6,6)C61), C71-PCBM, C84-PCBM, bis-PCBM, perylene, NTCDA (1,4,5,8-naphthalene-tetracarboxylic dianhydride), $Alq_3$, a derivative thereof, and a combination thereof; an n-type inorganic semiconductor including one of CdS, CdTe, CdSe, ZnO, and a combination thereof; and a combination thereof.

The electron transport layer (ETL) may include one of NTCDA (1,4,5,8-naphthalene-tetracarboxylic dianhydride), BCP (bathocuproine), LiF, Alq$_3$, Gaq$_3$, Inq$_3$, Znq$_2$, Zn(BTZ)$_2$, BeBq$_2$, and a combination thereof.

The hole blocking layer may include one of NTCDA (1,4,5,8-naphthalene-tetracarboxylic dianhydride), BCP (bathocuproine), LiF, Alq$_3$, Gaq$_3$, Inq$_3$, Znq$_2$, Zn(BTZ)$_2$, BeBq$_2$, and a combination thereof.

BRIEF DESCRIPTION OF THE DRAWINGS

The foregoing and other features and advantages of inventive concepts will be apparent from the more particular description of non-limiting embodiments of inventive concepts, as illustrated in the accompanying drawings in which like reference characters refer to the same parts throughout the different views. The drawings are not necessarily to scale, emphasis instead being placed upon illustrating the principles of inventive concepts. In the drawings.

DETAILED DESCRIPTION

Figure 1:
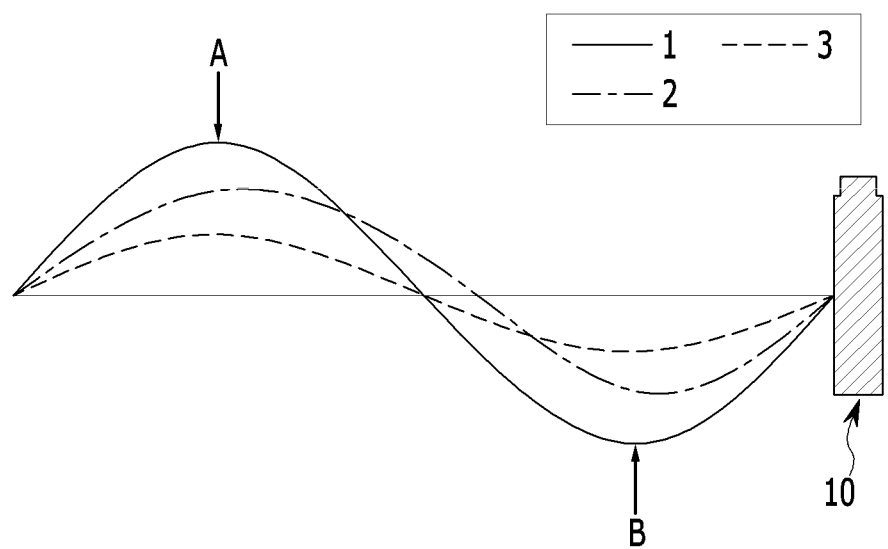
FIG. 1 is a schematic view of a standing wave according to example embodiments.

Example embodiments will now be described more fully hereinafter with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scopes of example embodiments of inventive concepts to those of ordinary skill in the art. In the drawings, the thickness of layers, films, panels, regions, etc., are exaggerated for clarity. Like reference numerals designate like elements throughout the specification, and thus their duplicative description will be omitted.

As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on"). It will be understood that when an element such as a layer, film, or substrate is referred to as being "on" another element, it may be directly on the other element or intervening elements may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

According to example embodiments, a photoelectric conversion device may include a first electrode disposed on a light-receiving surface; a second electrode disposed to be spaced away from the first electrode and facing the first electrode; an exciton producing layer disposed between the first electrode and the second electrode; and an auxiliary layer disposed between the second electrode and the exciton producing layer. The exciton producing layer is disposed in a region including a crest or a trough of a standing wave of light to be converted into electricity.

FIG. 1 is a schematic view of a standing wave according to example embodiments.

Referring to FIG. 1, the standing wave 1 is a wave formed by a combination of an incident wave 2 and a reflective wave 3 reflected from an electrode 10. In this case, A refers to a crest and B refers to a trough.

The standing wave may have a wavelength of a visible ray region to a near infrared ray region, for example, a wavelength of about 380 nm to about 950 nm, or a wavelength of about 380 nm to about 800 nm, or a wavelength of about 600 nm to about 800 nm.

The photoelectric conversion device disposes the exciton producing layer in the region including a crest or a trough of the standing wave of light to be converted into electricity so as to make the exciton producing layer effectively absorb light. Thereby, it may effectively produce excitons to improve photoelectric conversion efficiency.

When the incident light and reflective light of light to be converted into electricity provide a standing wave, the amplitude of the wavelength in the rib and groove is increased by twice and the intensity thereof is increased by four times. Accordingly, when the exciton producing layer is disposed in the region including the crest or the trough of the standing wave, the exciton producing layer absorbs a greater amount of light and a higher intensity of light to effectively produce excitons.

For example, the photoelectric conversion device may improve the photoelectric conversion efficiency by disposing the exciton producing layer in the region including the region (crest or trough) at ¼ of the wavelength of the standing wave away from the second electrode, where the node of the standing wave is formed or the region (crest or trough) at ¾ of the wavelength of the standing wave away from the second electrode, where the node of the standing wave is formed.

Figure 2:
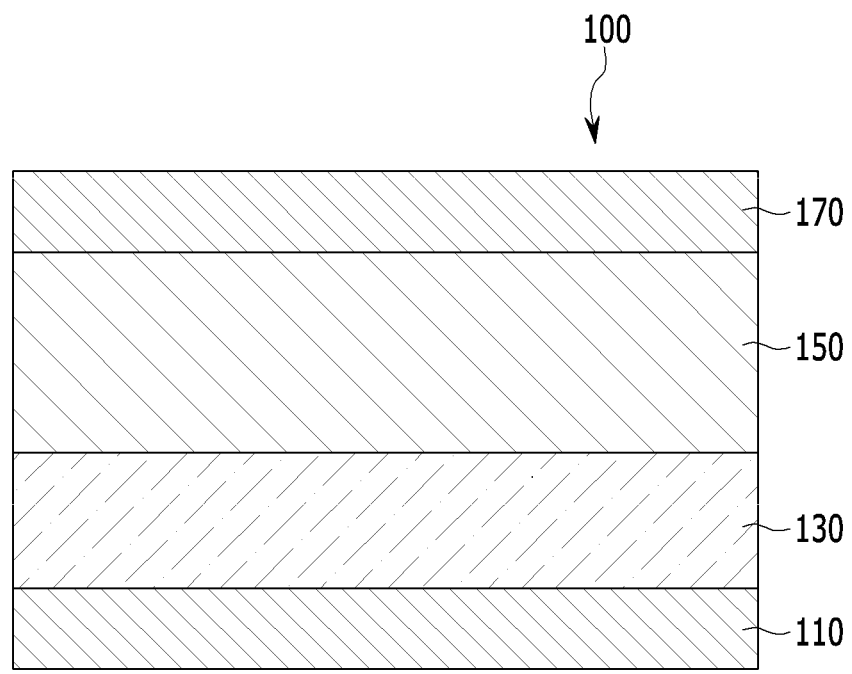
FIG. 2 is a schematic cross-sectional view of the photoelectric conversion device according to example embodiments.

FIG. 2 is a schematic cross-sectional view of a photoelectric conversion device according to example embodiments.

Hereinafter, for better understanding and ease of description, the light-receiving surface of the exciton producing layer 150 that receives light is referred to as a front side, and the opposite side is referred to as a rear side.

Referring to FIG. 2, the photoelectric conversion device 100 according to example embodiments includes a front electrode 170 and a rear electrode 110 spaced apart by a certain interval and facing each other, an auxiliary layer 130 disposed on the rear electrode 110, and an exciton producing layer 150 disposed between the auxiliary layer 130 and the front electrode 170.

The rear electrode 110 may include a metal or a transparent conductive material.

The metal may include one selected from Al, Cu, Ti, Au, Pt, Ag, Cr, Li, and a combination thereof. The transparent conductive material may include one selected from ITO, indium-doped ZnO (IZO), aluminum-doped ZnO (AZO), gallium-doped ZnO (GZO), antimony-doped tin oxide (ATO), fluorine-doped tin oxide (FTO), tin oxide ($SnO_2$), ZnO, $TiO_2$, and a combination thereof, without limitation.

When the rear electrode 110 includes a metal, it may be formed as a semi-transparent electrode with a thickness of equal to or less than about 20 nm, but example embodiments are not limited thereto.

The front electrode 170 may include a transparent conductive material. Unless mentioned otherwise, the transparent conductive material may be the same as described above.

The front electrode 170 may have an equal or higher work function than the rear electrode 110, but is not limited thereto. When the front electrode 170 has a work function of more than the rear electrode 110, electrons separated from excitons obtained from the exciton producing layer 150 may be collected into the rear electrode 110, and holes separated from the excitons may be collected into the front electrode 170.

The exciton producing layer 150 plays a role of converting light into electric signals using the photoelectric effect, and it may be provided within the distance ($L_1$) range represented by the following Equation 1 from the rear electrode 110. However, example embodiments are not limited thereto, and the exciton producing layer 150 may be provided in any region as long as it is within the range including the crest and the trough of a standing wave of light to be converted into electricity.

$$(\lambda_{standing\ wave}/(4*(n_{auxiliary})))-\alpha \leq L_1 = (\lambda_{standing\ wave}/(4*(n_{auxiliary})))+\alpha \quad \text{[Equation 1]}$$

In Equation 1, $\lambda_{standing\ wave}$ is a wavelength of a standing wave of light for converting into electricity, $n_{auxiliary}$ is a refractive index of the material of the auxiliary layer, and $L_1$ is a distance from the rear electrode 110, and may be a direct distance from the rear electrode 110. Values for a range from about 0 nm to about 20 nm, and for example, about 0 nm to about 10 nm. Unless mentioned otherwise hereinafter, the standing wave is the same as described above.

The exciton producing layer 150 is disposed in a range of a distance $L_1$ represented by the above Equation 1 from the rear electrode 110, so the exciton producing layer 150 may effectively absorb light. Thereby, the exciton producing layer 150 may effectively produce excitons by the absorbed light so as to improve the photoelectric conversion efficiency.

The photoelectric conversion device 100 may improve the photoelectric conversion efficiency and also provide a thin thickness by disposing the exciton producing layer 150 in the region including a position (crest or trough) at ¼ of the wavelength of the standing wave away from the second electrode 110 where the node of the standing wave is formed.

The exciton producing layer 150 may include one selected from a bulk heterojunction (BHJ), an organic/inorganic hybrid layer, a p layer, and a combination thereof, but is not limited thereto.

The bulk heterojunction may include at least two selected from polyaniline, polypyrrole, polythiophene, poly(p-phenylene vinylene), MEH-PPV (poly(2-methoxy-5-(2'-ethyl-hexyloxy)-1,4-phenylene vinylene)), MDMO-PPV (poly(2-methoxy-5-(3,7-dimethyloctyloxy)-1,4-phenylene vinylene)), pentacene, PEDOT (poly(3,4-ethylene dioxythiophene)), poly(3-alkylthiophene), phthalocyanine, tin(II) phthalocyanine (SnPc), copper phthalocyanine, triarylamine, benzidine, pyrazoline, styrylamine, hydrazone, carbazole, thiophene, EDOT (3,4-ethylene dioxythiophene), pyrrole, phenanthrene, tetracene, naphthalene, rubrene, NTCDA (1,4,5,8-naphthalene-tetracarboxylic dianhydride), $Alq_3$, fullerene (C60, C70, C74, C76, C78, C82, C84, C720, C860, and the like), PCBM (1-(3-methoxy-carbonyl)propyl-1-phenyl(6,6)C61), C71-PCBM, C84-PCBM, bis-PCBM, perylene, a derivative thereof, and a combination thereof, without limitation. When using materials having different energy levels from each other in providing a bulk heterojunction, a material having a relatively low LUMO (lowest unoccupied molecular orbital) level may be used for an n-type material, and a material having a relatively high LUMO level may be used for a p-type material.

The organic/inorganic hybrid layer may include an organic material selected from polyaniline, polypyrrole, polythiophene, poly(p-phenylene vinylene), MEH-PPV (poly(2-methoxy-5-(2'-ethyl-hexyloxy)-1,4-phenylene vinylene)), MDMO-PPV (poly(2-methoxy-5-(3,7-dimethyl-octyloxy)-1,4-phenylene vinylene)), pentacene, PEDOT (poly(3,4-ethylene dioxythiophene)), poly(3-alkylthiophene), phthalocyanine, tin(II) phthalocyanine (SnPc), copper phthalocyanine, triarylamine, benzidine, pyrazoline, styrylamine, hydrazone, carbazole, thiophene, EDOT (3,4-ethylene dioxythiophene), pyrrole, phenanthrene, tetracene, naphthalene, rubrene, NTCDA (1,4,5,8-naphthalene-tetracarboxylic dianhydride), $Alq_3$, fullerene (C60, C70, C74, C76, C78, C82, C84, C720, C860, and the like), PCBM (1-(3-methoxy-carbonyl)propyl-1-phenyl(6,6)C61), C71-PCBM, C84-PCBM, bis-PCBM, perylene, a derivative thereof, and a combination thereof, without limitation, and an inorganic semiconductor selected from CdS, CdTe, CdSe, ZnO, and a combination thereof, without limitation. When using materials having different energy levels from each other when providing an organic/inorganic hybrid layer, a material having a relatively low LUMO (lowest unoccupied molecular orbital) level may be used for an n-type material, and a material having relatively high LUMO level may be used for a p-type material.

The p layer may include a p-type material including one selected from polyaniline, polypyrrole, polythiophene, poly(p-phenylene vinylene), MEH-PPV (poly(2-methoxy-5-(2'-ethyl-hexyloxy)-1,4-phenylene vinylene)), MDMO-PPV (poly(2-methoxy-5-(3,7-dimethyloctyloxy)-1,4-phenylene vinylene)), pentacene, PEDOT (poly(3,4-ethylene dioxythiophene)), poly(3-alkylthiophene), phthalocyanine, tin(II) phthalocyanine (SnPc), copper phthalocyanine, triarylamine, benzidine, pyrazoline, styrylamine, hydrazone, carbazole, thiophene, EDOT (3,4-ethylene dioxythiophene), pyrrole, phenanthrene, tetracene, naphthalene, rubrene, a derivative thereof, and a combination thereof, but is not limited thereto.

The exciton producing layer 150 may have a thickness of about 10 nm to about 200 nm. When the exciton producing layer 150 has a thickness within the range, it may effectively absorb light to be converted into electricity so as to effectively improve the photoelectric conversion efficiency. For example, the exciton producing layer 150 may have a thickness of about 10 nm to about 100 nm, for example, about 10 nm to about 50 nm, or about 10 nm to about 20 nm.

The auxiliary layer 130 may be provided in a single layer, but example embodiments are not limited thereto, and it may be provided in a plurality of layers.

For example, the auxiliary layer 130 may include one selected from an n layer, an electron transport layer (ETL), a hole blocking layer (HBL), and a combination thereof.

When the exciton producing layer 150 is a p layer, the n layer may provide a p-n junction and include an n-type material including one selected from an n-type organic material selected from fullerene (C60, C70, C74, C76, C78, C82, C84, C720, C860, and the like), PCBM (1-(3-methoxy-carbonyl)propyl-1-phenyl(6,6)C61), C71-PCBM, C84-PCBM, bis-PCBM, perylene, NTCDA (1,4,5,8-naphthalene-tetracarboxylic dianhydride), Alq$_3$, a derivative thereof, and a combination thereof; a n-type inorganic semiconductor selected from CdS, CdTe, CdSe, ZnO, and a combination thereof; and a combination thereof, without limitation.

The electron transport layer (ETL) may play a role of facilitating the transport of electrons, and may include one selected from NTCDA (1,4,5,8-naphthalene-tetracarboxylic dianhydride), BCP (bathocuproine), LiF, Alq$_3$, Gaq$_3$, Inq$_3$, Znq$_2$, Zn(BTZ)$_2$, BeBq$_2$, and a combination thereof, without limitation.

The hole blocking layer (HBL) may play a role of prohibiting the transport of holes and simultaneously play a role of a protective layer for preventing an electrical short, and it may include one selected from NTCDA (1,4,5,8-naphthalene-tetracarboxylic dianhydride), BCP (bathocuproine), LiF, Alq$_3$, Gaq$_3$, Inq$_3$, Znq$_2$, Zn(BTZ)$_2$, BeBq$_2$, and a combination thereof, without limitation.

As described above, the photoelectric conversion device 100 may improve the photoelectric conversion efficiency and also provide a thin thickness by disposing the exciton producing layer 150 in the region including a position (crest or trough) of ¼ of the wavelength of the standing wave away from the second electrode 110 where the node of the standing wave is formed.

Although not shown in FIG. 2, one selected from a hole transporting layer (HTL), an electron blocking layer (EBL), and a combination thereof may be formed between the front electrode 170 and the exciton producing layer 150.

The hole transporting layer (HTL) may play a role of facilitating the transport of holes, and may include one selected from PEDOT:PSS (poly(3,4-ethylene dioxythiophene):poly(styrene sulfonate)), BP3T (biphenyltrithiophene), poly(arylamine), poly(N-vinylcarbazole), polyaniline, polypyrrole, TPD (N,N,N',N'-tetrakis(4-methoxyphenyl)-benzidine), α-NPD (4-bis(N-(1-naphthyl)-N-phenyl-amino)biphenyl), m-MTDATA (4,4',4"-tris[3-methylphenyl(phenyl)-amino]triphenylamine), TCTA (4,4',4"-tris(N-carbazolyl)-triphenylamine), and a combination thereof, without limitation.

The electron blocking layer (EBL) may act a role of prohibiting the transport of electron and may include one selected from PEDOT:PSS (poly(3,4-ethylene dioxythiophene):poly(styrene sulfonate)), BP3T (biphenyltrithiophene), poly(arylamine), poly(N-vinylcarbazole), polyaniline(polyaniline), polypyrrole, TPD (N,N,N',N'-tetrakis(4-methoxyphenyl)-benzidine), α-NPD (4-bis(N-(1-naphthyl)-N-phenyl-amino)biphenyl), m-MTDATA (4,4',4"-tris[3-methylphenyl(phenyl)-amino]triphenylamine), TCTA (4,4',4"-tris(N-carbazolyl)-triphenylamine), and a combination thereof, without limitation.

EXAMPLES

The following examples are described below in more detail. However, they are example embodiments of this disclosure and are not limiting.

Example 1: Fabrication of Photoelectric Conversion Device

An ITO glass is prepared as a front electrode. The ITO glass is cleaned with water/ultrasonic waves and cleaned with methanol and acetone to perform an O$_2$ plasma treatment. A poly(3,4-ethylene dioxythiophene):poly(styrene sulfonate) (PEDOT:PSS) layer is provided on the ITO glass by spin coating. Then a BP3T(EBL) layer, a tin(II) phthalocyanine (SnPc) layer, a tin(II) phthalocyanine:C60(SnPc:C60) layer, and a C60 layer are sequentially provided on the PEDOT:PSS layer according to thermal evaporation under a $1 \times 10^{-7}$ torr pressure and in an evaporation speed of 1 Å/s. An Al electrode is provided on the C60 layer according to thermal evaporation at an evaporation speed of about 5 Å/s.

Thereby, a photoelectric conversion device is provided.

The structure of photoelectric conversion device may be expressed as ITO/PEDOT:PSS/BP3T(EBL)/SnPc/SnPc:C60/C60/Al, and the ITO electrode is a front electrode for receiving light, while the Al electrode is a rear electrode.

In the obtained photoelectric conversion device, the PEDOT:PSS layer has a thickness of about 30 nm to about 50 nm; the BP3T layer has a thickness of about 15 nm; the SnPc layer has a thickness of about 5 nm; the SnPc:C60 layer has a thickness of about 20 nm (mole ratio=3:1); the C60 layer has a thickness of about 90 nm; and the Al electrode has a thickness of about 100 nm.

The exciton producing layer of the SnPc:C60 layer is disposed at a position at a range of about 90 nm to about 110 nm away from the rear Al electrode.

The auxiliary layer of C60 has a refractive index of 2.05 at a wavelength of 750 nm. With reference to the refractive index, when the appropriate position of the exciton producing layer is calculated by substituting in Equation 1, the exciton producing layer may be provided at the position of about 70 nm to about 110 nm away from the rear Al electrode.

Comparative Example 1: Fabrication of Photoelectric Conversion Device

A photoelectric conversion device having a structure of ITO/PEDOT:PSS/BP3T(EBL)/SnPc/SnPc:C60/C60/Al is fabricated in accordance with the same procedure as in Example 1.

In the obtained photoelectric conversion device, the PEDOT:PSS layer has a thickness of about 30 nm to about 50 nm; the BP3T layer has a thickness of about 15 nm; the SnPc layer has a thickness of about 5 nm; the SnPc:C60 layer has a thickness of about 20 nm (mole ratio=3:1); the C60 layer has a thickness of about 110 nm; and the Al electrode has a thickness of about 100 nm.

The exciton producing layer of the SnPc:C60 layer is disposed in a range of about 110 nm to about 130 nm away from the rear Al electrode.

Comparative Example 2: Fabrication of Photoelectric Conversion Device

A photoelectric conversion device having a structure of ITO/PEDOT:PSS/BP3T(EBL)/SnPc/SnPc:C60/C60/Al is fabricated in accordance with the same procedure as in Example 1.

In the obtained photoelectric conversion device, the PEDOT:PSS layer has a thickness of about 30 nm to about 50 nm; the BP3T layer has a thickness of about 15 nm; the SnPc layer has a thickness of about 5 nm; the SnPc:C60 layer has a thickness of about 20 nm (mole ratio=3:1); the C60 layer has a thickness of about 10 nm; and the Al electrode has a thickness of about 100 nm.

The exciton producing layer of the SnPc:C60 layer is disposed in a range of about 10 nm to about 30 nm away from the rear Al electrode.

Experimental Example 1: Measurement of External Quantum Efficiency (EQE)

Figure 3:
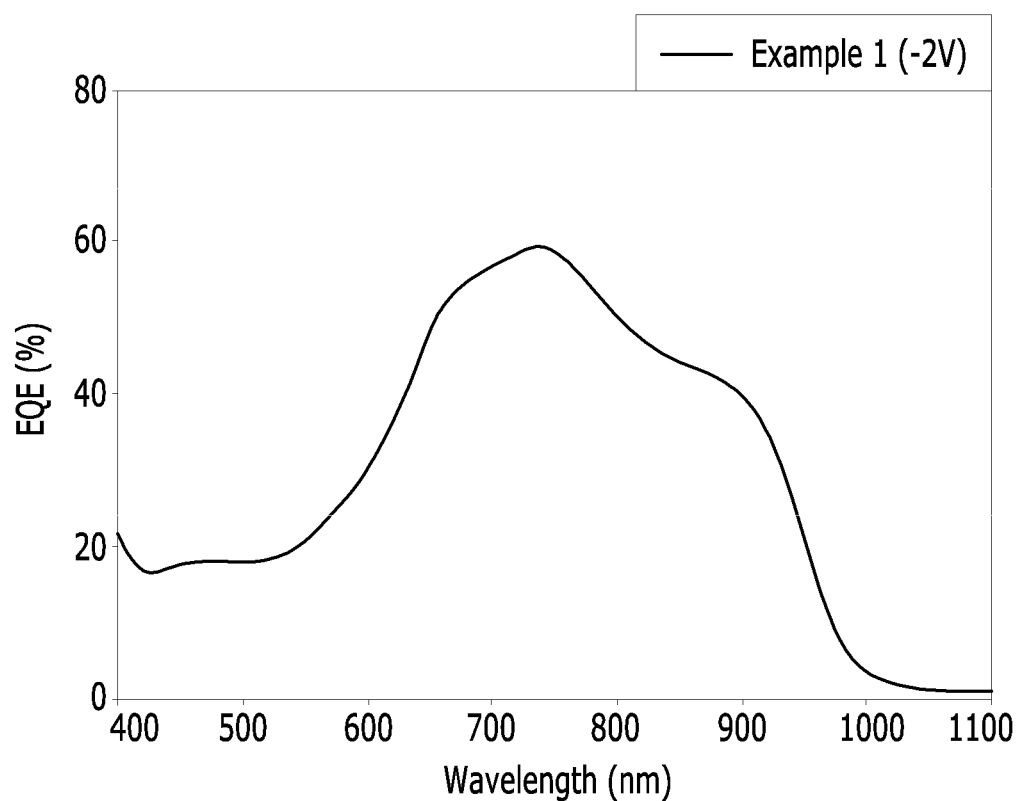
FIG. 3 is a graph showing external quantum efficiency of the photoelectric conversion device according to Example 1.

The photoelectric conversion device obtained from Example 1 is irradiated by monochromatic light from an ITO direction to measure external quantum efficiency according to the wavelength. FIG. 3 is a graph showing external quantum efficiency of the photoelectric conversion device according to Example 1. The monochromatic light includes a xenon lamp and monochrometer, and a function generator (Hokudo Denko, Ltd., HB-104) is used.

As shown in FIG. 3, the photoelectric conversion device obtained from Example 1 shows excellent external quantum efficiency at a wavelength of about 650 nm to about 900 nm, and shows the maximum external quantum efficiency at a wavelength of about 750 nm. This corresponds to the appropriate position of the exciton producing layer that is calculated according to Equation 1 in Example 1.

On the other hand, the photoelectric conversion devices obtained from Comparative Examples 1 and 2 are anticipated to have inferior external quantum efficiency to the photoelectric conversion device obtained from Example 1 at a wavelength of about 650 nm to about 900 nm.

These results from the incident light being effectively absorbed by providing the exciton producing layer of the photoelectric conversion device according to Example 1 in the region including the position of ¼ of the wavelength of the standing wave away from the rear electrode.

While some example embodiments have been particularly shown and described, it will be understood by one of ordinary skill in the art that variations in form and detail may be made therein without departing from the spirit and scope of the claims.

What is claimed is:

1. A photoelectric conversion device comprising:
a first electrode including a light-receiving surface;
a second electrode spaced apart from the first electrode and facing the first electrode, the first electrode on the second electrode; and
an auxiliary layer between the second electrode and an exciton producing layer,
the exciton producing layer between the first electrode and the second electrode, and
the exciton producing layer being spaced apart from the second electrode by a distance (D) corresponding to one of a crest and a trough of a standing wave of light to be converted into electricity, the distance D being 70 nm<D≤about 110 nm,
wherein
the exciton producing layer is in direct contact with the first electrode,
the auxiliary layer is an n layer,
the n layer is a single layer of a n-type fullerene,
the exciton producing layer is in direct contact with the auxiliary layer,
the auxiliary layer is in direct contact with the second electrode.

2. The photoelectric conversion device of claim 1, wherein the exciton producing layer comprises one of a bulk heterojunction (BHJ), an organic/inorganic hybrid layer, a p layer, and a combination thereof.

3. The photoelectric conversion device of claim 2, wherein
the exciton producing layer includes the bulk heterojunction, and
the bulk heterojunction includes at least two of
polyaniline, polypyrrole, polythiophene, poly(p-phenylene vinylene), MEH-PPV (poly(2-methoxy-5-(2'-ethyl-hexyloxy)-1,4-phenylene vinylene)), MDMO-PPV (poly(2-methoxy-5-(3,7-dimethyloctyloxy)-1,4-phenylene vinylene)), pentacene, PEDOT (poly(3,4-ethylene dioxythiophene)), poly(3-alkylthiophene), phthalocyanine, tin(II) phthalocyanine (SnPc), copper phthalocyanine, triarylamine, benzidine, pyrazoline, styrylamine, hydrazone, carbazole, thiophene, EDOT (3,4-ethylene dioxythiophene), pyrrole, phenanthrene, tetracene, naphthalene, rubrene, NTCDA (1,4,5,8-naphthalene-tetracarboxylic dianhydride), Alq$_3$, fullerene (C60, C70, C74, C76, C78, C82, C84, C720, C860, and a combination thereof), PCBM (1-(3-methoxycarbonyl)propyl-1-phenyl(6,6)C61), C71-PCBM, C84-PCBM, bis-PCBM, perylene, a derivative thereof, or a combination thereof.

4. The photoelectric conversion device of claim 2, wherein
the exciton producing layer includes the organic/inorganic hybrid layer, and
the organic/inorganic hybrid layer comprises:
an organic material including one of polyaniline, polypyrrole, polythiophene, poly(p-phenylene vinylene), MEH-PPV (poly(2-methoxy-5-(2'-ethyl-hexyloxy)-1, 4-phenylene vinylene)), MDMO-PPV (poly(2-methoxy-5-(3,7-dimethyloctyloxy)-1,4-phenylene vinylene)), pentacene, PEDOT (poly(3,4-ethylene dioxythiophene)), poly(3-alkylthiophene), phthalocyanine, tin(II) phthalocyanine (SnPc), copper phthalocyanine, triarylamine, benzidine, pyrazoline, styrylamine, hydrazone, carbazole, thiophene, EDOT (3,4-ethylene dioxythiophene), pyrrole, phenanthrene, tetracene, naphthalene, rubrene, NTCDA (1,4,5,8-naphthalene-tetracarboxylic dianhydride), $Alq_3$, fullerene (C60, C70, C74, C76, C78, C82, C84, C720, C860, and a combination thereof), PCBM (1-(3-methoxy-carbonyl) propyl-1-phenyl(6,6)C61), C71-PCBM, C84-PCBM, bis-PCBM, perylene, a derivative thereof, or a combination thereof, and an inorganic semiconductor selected from CdS, CdTe, CdSe, ZnO, and a combination thereof.

5. The photoelectric conversion device of claim 2, wherein the p layer comprises a p-type material including one of polyaniline, polypyrrole, polythiophene, poly(p-phenylene vinylene), MEH-PPV (poly(2-methoxy-5-(2'-ethyl-hexyloxy)-1,4-phenylene vinylene)), MDMO-PPV (poly(2-methoxy-5-(3,7-dimethyloctyloxy)-1,4-phenylene vinylene)), pentacene, PEDOT (poly(3,4-ethylene dioxythiophene)), poly(3-alkylthiophene), phthalocyanine, tin(II) phthalocyanine (SnPc), copper phthalocyanine, triarylamine, benzidine, pyrazoline, styrylamine, hydrazone, carbazole, thiophene, EDOT (3,4-ethylene dioxythiophene), pyrrole, phenanthrene, tetracene, naphthalene, rubrene, a derivative thereof, or a combination thereof.

6. The photoelectric conversion device of claim 1, wherein the exciton producing layer includes a thickness of about 10 nm to about 200 nm.

7. The photoelectric conversion device of claim 1, wherein the first electrode comprises a transparent conductive material.

8. The photoelectric conversion device of claim 1, wherein the second electrode comprises a metal or a transparent conductive material.

9. The photoelectric conversion device of claim 1, wherein a work function of the first electrode is the same or higher than a work function of the second electrode.

10. The photoelectric conversion device of claim 1, wherein
the n-type fullerene includes one of C60, C70, C74, C76, C78, C82, C84, C720, C860, or a combination thereof.

11. The photoelectric conversion device of claim 1, wherein each of the exciton producing layer and the second electrode has a thickness that is greater than 0 nm and less than or equal to than about 20 nm.

12. The photoelectric conversion device of claim 1, wherein
the distance D corresponds to a distance between an upper surface of the second electrode and a lower surface of the exciton producing layer.

13. The photoelectric conversion device of claim 12, wherein
the distance D is greater than about 90 nm and less than or equal to about 110 nm.

14. The photoelectric conversion device of claim 12, wherein
the standing wave is formed by a combination of an incident wave received by the first electrode and a reflected wave reflected from the second electrode towards the first electrode, and
the auxiliary layer is configured to increase an absorbance of the exciton producing layer at a wavelength corresponding to the standing wave.

15. A photoelectric conversion device, comprising:
a first electrode including a light-receiving surface;
a second electrode spaced apart from the first electrode and facing the first electrode, the first electrode on the second electrode;
an auxiliary layer between the first electrode and the second electrode, wherein the auxiliary layer is an n layer; and
an exciton producing layer between the first electrode and the auxiliary layer, the exciton producing layer being between the first electrode and the second electrode,
a lower surface of the exciton producing layer being spaced apart from an upper surface of the second electrode by a distance (D) corresponding to one of a crest and a trough of a standing wave of light to be converted into electricity, the distance (D) being 70 nm<D≤about 110 nm,
the exciton producing layer being in direct contact with the first electrode, wherein
the n layer is a single layer of a n-type fullerene,
the exciton producing layer is in direct contact with the auxiliary layer,
the auxiliary layer is in direct contact with the second electrode.

* * * * *